United States Patent [19]
Konjuh et al.

[11] Patent Number: 6,051,282
[45] Date of Patent: Apr. 18, 2000

[54] SURFACE TREATMENT OF ANTIREFLECTIVE LAYER IN CHEMICAL VAPOR DEPOSITION PROCESS

[75] Inventors: Katherina Konjuh, San Jose; Wilbert G. M. van den Hoek, Cupertino, both of Calif.

[73] Assignee: Novellus Systems, Inc., San Jose, Calif.

[21] Appl. No.: 09/090,848

[22] Filed: Jun. 4, 1998

[51] Int. Cl.[7] .............................. B05D 3/06; C23C 16/30
[52] U.S. Cl. .................... 427/539; 427/167; 427/255.27; 427/255.4; 427/255.7
[58] Field of Search ..................................... 427/167, 535, 427/539, 255.27, 255.4, 255.7

[56] References Cited

U.S. PATENT DOCUMENTS 5,710,067  1/1998  Foot et al. ............................. 427/574

OTHER PUBLICATIONS

T. Ogawa et al., "Practicle Resolution Enhancement Effect by New Complete Anti–Reflective Layer in KrF Excimer Laser Lithography", SPIE vol. 1927 Optical/Laser Microlithography VI, 1993, pp. 263–274.

T. Perera, "Antireflective Coatings—an Overview", Jul. 1995, Solid State Technology, pp. 131–136.

*Primary Examiner*—Roy V. King
*Attorney, Agent, or Firm*—Skjerven, Morrill, MacPherson, Franklin & Friel LLP; David E. Steuber

[57] ABSTRACT

In a chemical vapor deposition process a surface layer is formed on an antireflective layer to prevent amines in the antireflective layer from neutralizing acid components formed during the exposure of an overlying photoresist layer. The surface layer is formed by introducing an oxygen-containing gas such as $N_2O$ into the CVD chamber in the presence of radio frequency power, after the antireflective layer has been formed.

10 Claims, 4 Drawing Sheets

SURFACE TREATMENT OF ANTIREFLECTIVE LAYER IN CHEMICAL VAPOR DEPOSITION PROCESS

BACKGROUND OF THE INVENTION

With the decreasing size of features that are fabricated in semiconductor wafers, antireflective layers are increasingly being used in photolithographic processes. An antireflective layer (ARL) is formed immediately below a photoresist layer. When the photoresist is exposed to light in the patterning process, the ARL inhibits the reflection of light from the interface between the photoresist layer and the underlying layer and thereby improves the definition of the pattern that is formed when the photoresist is developed. For a general discussion of the use of ARLs, see T. Perara, "Anti-Reflective Coatings: An Overview"; Solid State Technology, Vol. 37, No. 7; pp. 131–136 (1995), which is incorporated herein by reference.

Another aspect of decreasing feature size is the use of light radiation having a shorter wavelength. Whereas "I-line" radiation having a wavelength of 365 nm has been the standard, deep ultraviolet (UV) radiation having a wavelength of 248 nm is now being used more frequently. This transition to a shorter wavelength requires a different type of ARL. Organic layers have been commonly used as ARLs for I-line radiation, although inorganic layers are increasingly being used. Layers of inorganic materials such as silicon oxynitride are predominately used for deep UV radiation. For a discussion of the use of deep UV ARLs, see T. Ogawa et al.; "Practical Resolution Enhancement Effect By New Complete Anti-Reflective Layer In KrS Excimer Laser Lithography"; Optical/Laser Microlithography; Session VI; Vol. 1927 (1993), incorporated herein by reference. Organic ARLs are relatively thick (e.g., 1500Å) and are typically spun on to the underlying substrate, while inorganic ARLs are generally thinner (e.g., 300Å) and are formed by chemical vapor deposition. An advantage of the inorganic ARLs is that they generally do not need to be removed after the photolithographic process has been completed. Also, the inorganic layers tend to be less expensive than the organic layers.

One problem with inorganic ARLs such as silicon oxynitride is that amines ($NH_2$ groups) form on the surface of the layer. The exposure of photoresists that are used with deep UV radiation generally creates an acidic reaction in the photoresist. The resulting acidic compounds then react with the developer to create a mask. Since the amines are basic, they tend to neutralize the acids generated by the exposure of the photoresist and thereby inhibit the development of the photoresist.

This problem is illustrated in FIG. 1, which shows a photoresist layer 10 and a silicon oxynitride ARL 18 overlying a substrate 12, which is to be patterned. Deep UV radiation 14 is incident on area of the top surface of photoresist layer 10, exposing a portion of the photoresist layer 10. Ideally, the exposed portion of the photoresist layer 10 is removed when photoresist layer 10 is developed, yielding the clean vertical walls denoted by the dashed lines. In practice, however, amines at the interface between photoresist layer 10 and ARL 18 neutralize some of the acids produced during exposure of photoresist layer 10 and interfere with the development process. The result is photoresist "footing" 16 which in turn interferes with the patterning of substrate 12.

SUMMARY OF THE INVENTION

The presence of amines at the surface of an antireflective layer (ARL), is counteracted by introducing an oxygen-containing gas in the presence of radio frequency power to form a surface layer on the antireflective layer. The oxygen-containing gas can be, for example, $N_2O$ and the RF power can be applied, for example, at a rate of from 0.6 W to 6 W per square centimeter of ARL surface for from 1 to 20 seconds.

The foregoing process is particularly useful when applied to an ARL formed of an inorganic material such as silicon oxynitride which is used to perform photolithographic processes with deep ultraviolet radiation.

BRIEF DESCRIPTION OF THE DRAWINGS

This invention will be better understood by reference to the following drawings and description, in which the same reference numerals are used to identify like components.

DESCRIPTION OF THE INVENTION

Figure 1:
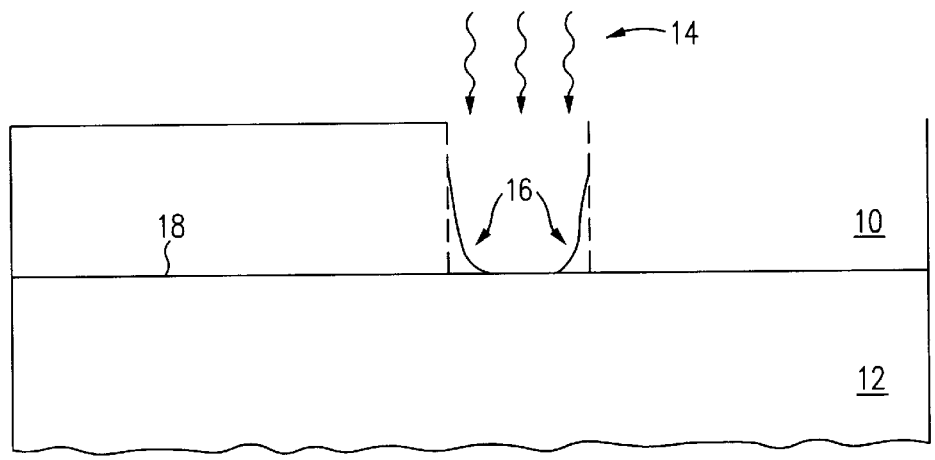
FIG. 1 illustrates the development of a "footing" in a photoresist layer using conventional technology.

This invention involves the formation of a surface layer on an antireflective layer to counteract the effect of amines ($NH_2$) on an overlying photoresist layer. The amines, which are basic, neutralize the acids that are formed when the photoresist layer is exposed to radiation and thereby prevent full development of the photoresist layer. As a result, the photoresist footing 16 shown in FIG. 1 is formed, and this footing prevents the accurate patterning of the underying substrate. The surface layer of this invention provides a barrier which prevents the amines from migrating into the photoresist layer.

In one embodiment, the surface layer is formed on an ARL of silicon oxynitride (SiON) by introducing $N_2O$ into the chamber of chemical vapor deposition unit in the presence of radio frequency power. The $N_2O$ is introduced at a rate of from 0.2 sccm to 8 sccm per square centimeter of wafer surface, preferably about 4 $sccm/cm^2$. The radio frequency power is applied at a rate of from 0.6 W to 6 W per square centimeter of wafer surface, preferably about 3 $W/cm^2$. The radio frequency power is typically applied for from 1 to 20 seconds.

Figure 2:
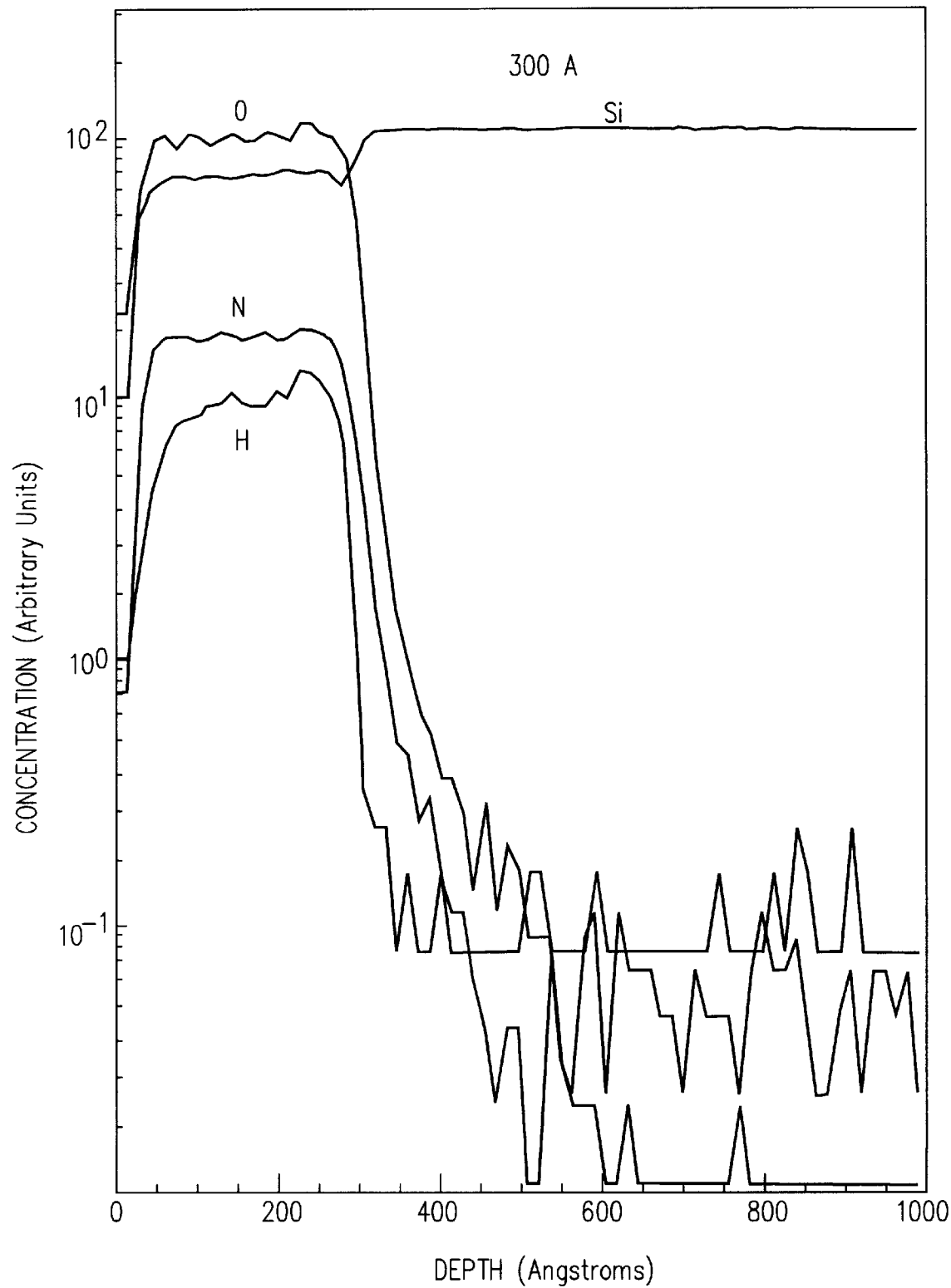
FIG. 2 illustrates a graph of Secondary Ion Mass Spectrometry (SIMS) data showing profiles of the concentration of H, N, Si and O at and beneath the surface of an oxynitride ARL which has not been treated with the process of this invention.
Figure 3:
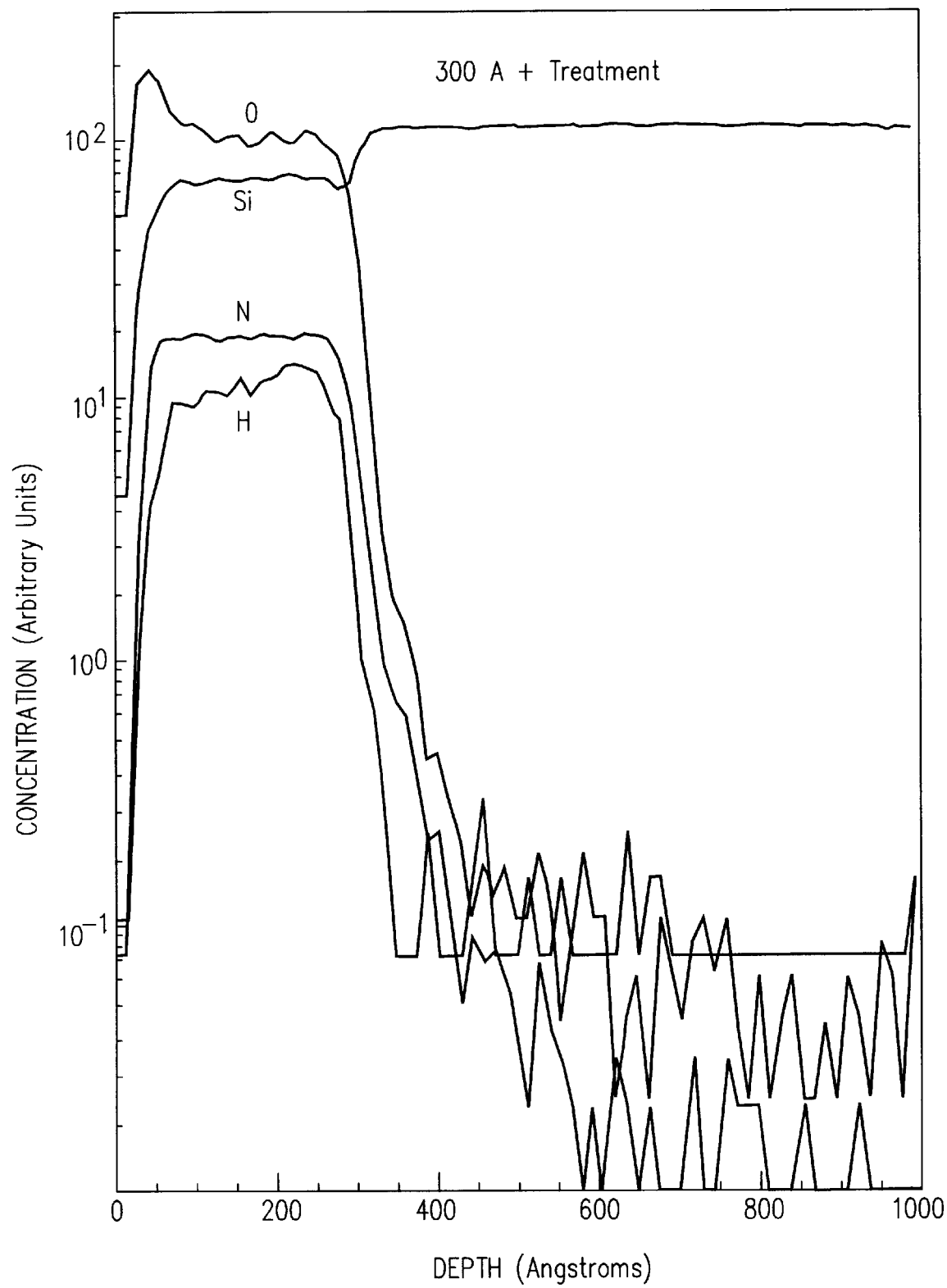
FIG. 3 illustrates a graph of SIMS data showing profiles of the concentration of H, N, Si and O at and beneath the surface of an oxynitride ARL which has been treated with the process of this invention.

The inventors believe the foregoing process forms a layer of $SiO_2$ at the surface of the antireflective layer. FIGS. 2 and 3 are graphs of data obtained by Secondary Ion Mass Spectrometry (SIMS) showing profiles of the concentration of H, N, Si and O at and beneath the surface of ARLs. In FIG. 2, the ARL had not been treated with the process of this invention, and in FIG. 3 the ARL had been treated with the process of this invention. The primary difference is the peak in the oxygen concentration which appears at the surface in FIG. 3. This peak is believed to represent a $SiO_2$ layer.

Figure 4:
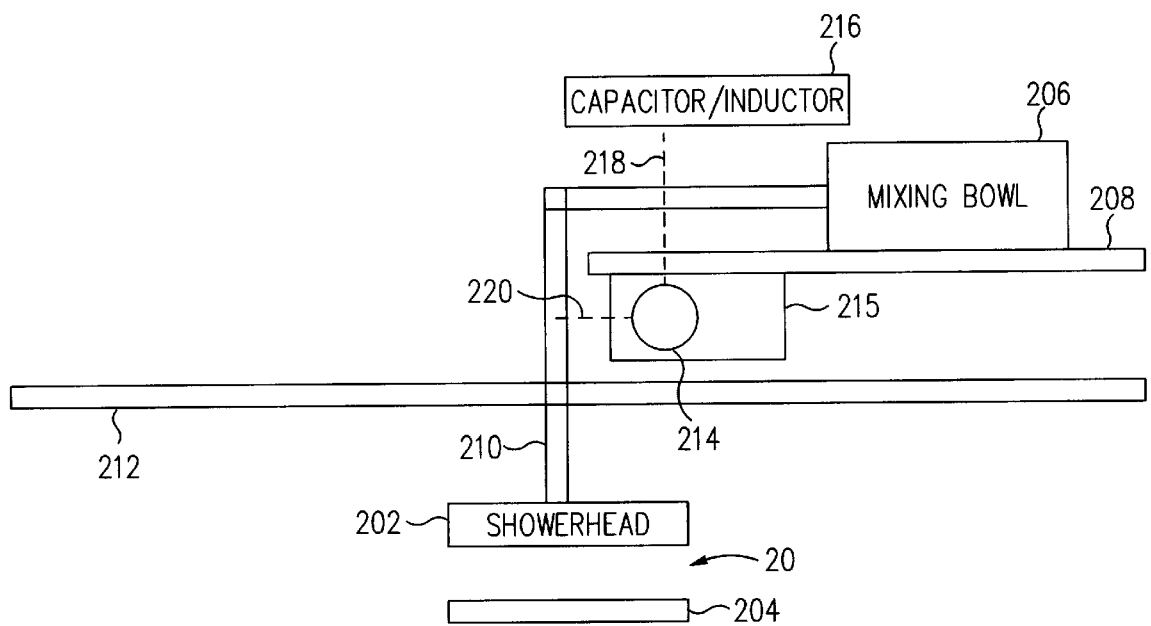
FIG. 4 illustrates a conceptual view of a chemical vapor deposition chamber adapted for use of the process of this invention.

FIG. 4 illustrates a conceptual view of a chemical vapor deposition (CVD) chamber 20 that has been adapted to perform the process of this invention. CVD chamber 20 includes a "showerhead" 202 that is used to introduce reactant gases for forming a thin film on a wafer 204. The reactant gases are combined in a mixing bowl 206, which rests on a mixing bowl plate support 208 and are delivered to showerhead 202 through an electrically conductive showerhead stem 210 that passes through a top plate 212 of CVD chamber 20. Showerhead stem 210 is insulated from top plate 212 by an insulator (not shown). Radio frequency electromagnetic energy is introduced via a vacuum relay 214 that is mounted on a vacuum relay support 215 on the bottom of plate support 208 and that connects a capacitor/inductor unit 216 to showerhead stem 210 by copper straps 218 and 220.

Figure 5:
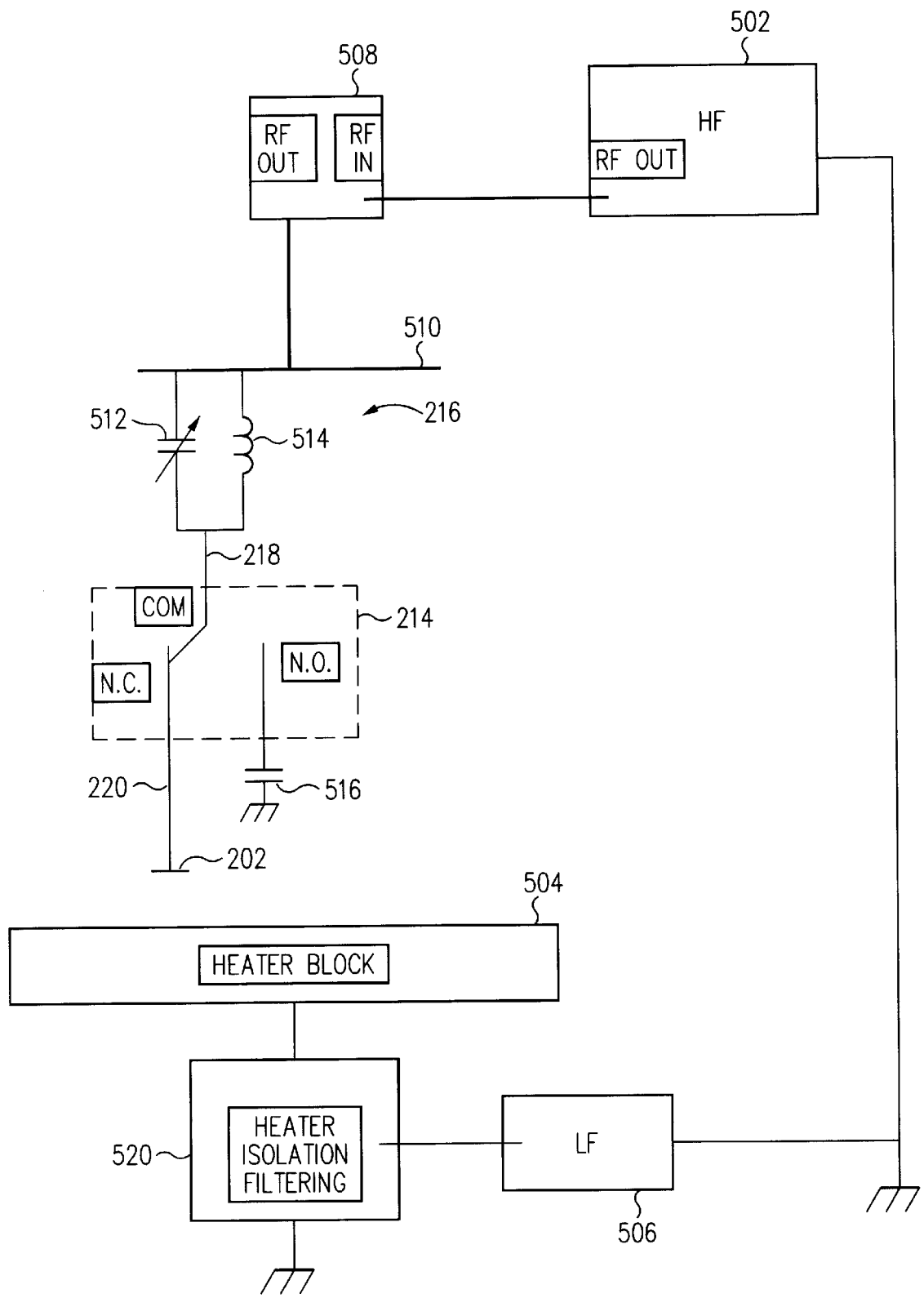
FIG. 5 illustrates a schematic circuit diagram of the electrical components of the chemical vapor deposition chamber.

FIG. 5 is a schematic circuit diagram of the electrical components of the CVD chamber shown in FIG. 4. Generally, high-frequency power (e.g., 13.56 MHz) is supplied to showerhead 202 by a high-frequency (HF) generator 502, and low-frequency power (e.g., 250 kHz) is supplied to the heater block 504 of the CVD chamber by a low-frequency (LF) generator 506. Both HF generator 502 and LF generator 506 are tied to chassis ground. The signal from HF generator 502 flows through an impedance matching network 508 and an RF distribution plate 510 to the capacitor/inductor unit 216. Capacitor/inductor unit 216 contains a variable capacitor 512 and an inductor 514 connected in parallel. Vacuum relay 214 functions as a single-pole, double-throw switch that directs the signal from capacitor/inductor unit 216 to showerhead 202 or to a "dummy" load capacitor 516 (e.g., 68 pF), when RF power is not to be delivered to showerhead 202.

In one embodiment, distribution plate 510 is a copper plate which distributes the HF signal to six showerheads, only one of which is shown in FIG. 5. There is a capacitor/inductor unit 216 and a vacuum relay 218 for each showerhead. Capacitor/inductor unit 216 serves as a balast to insure that each of the showerheads 202 is energized by the HF signal at the same time. For example, variable capacitor 512 can be set at 1000 pF, and inductor 514 can have a value of 50 $\mu$H. Impedance matching network 508 can be a model 2218-001 from Trazar Company of Santa Clara, Calif.; and vacuum relay 214 can be a model 1868-001 or 1869-001 from Conteq Corp. of Santa Clara, Calif.

A heater isolation filtering unit 520, connected between LF generator 506 and heater block 504, isolates the 250 kHz signal supplied by LF generator 506 from the 60 Hz power that is used to heat the heater block 504.

The method of this invention is particularly useful in conjunction with a multiple-station CVD unit such as the SEQUEL, manufactured by Novellus Systems, Inc. of San Jose, Calif. In this type of unit the antireflective layer is preferably deposited as a series of sublayers each of which is formed at a different processing station, as described in the commonly assigned application Ser. No. 08/987,905, filed Dec. 9, 1997 now abandoned, which is incorporated herein by reference in its entirety. The apparatus for introducing the radio frequency power, as shown in FIG. 4, for example, is connected to the last station in the unit. This permits the surface layer to be formed in situ after the ARL has been deposited but before the wafer is removed from the chamber for photolithgraphic processing.

The foregoing example is illustrative only and not limiting of the scope of this invention. For example, in some embodiments other oxygen-containing gases such as pure oxygen can be substituted for the $N_2O$. Pure oxygen is not desirable, however, in processes where silane or another gas which reacts with oxygen in the absence of a plasma is used before or after the formation of the surface layer. In such cases the chamber would have to be flushed of the reactive gas before the oxygen is introduced. Moreover, this invention can be used on ARLs made of materials other than silicon oxynitride, such as titanium nitride, which is used in patterning metal layers.

We claim:

1. A method of fabricating a surface layer on an antireflective layer in a chemical vapor deposition chamber, the method comprising:

forming a first layer that is to be patterned;

forming an antireflective layer over the first layer; and introducing an oxygen-containing gas into the chamber while applying radio frequency power to the chamber so as to form the surface layer on the antireflective layer.

2. The method of claim 1 wherein introducing an oxygen-containing gas comprises introducing $N_2O$.

3. The method of claim 1 wherein introducing an oxygen-containing gas comprises introducing pure oxygen.

4. The method of claim 1 wherein introducing an oxygen-containing gas comprises introducing the oxygen-containing gas at a flow rate of from 0.2 sccm to 8 sccm per square centimeter of the surface of the antireflective layer.

5. The method of claim 4 wherein introducing an oxygen-containing gas comprises introducing the oxygen-containing gas at a rate of about 4 sccm per square centimeter of the surface of the antireflective layer.

6. The method of claim 1 wherein applying radio frequency power is performed at a power intensity of from 0.6 W to 6 W per square centimeter of the surface of the antireflective layer.

7. The method of claim 6 wherein applying radio frequency power is performed at a power intensity of about 3 W per square centimeter of the surface of the antireflective layer.

8. The method of claim 1 wherein applying radio frequency power is performed for from 1 to 20 seconds.

9. The method of claim 1 wherein forming an antireflective layer comprises forming a layer comprising silicon oxynitride.

10. The method of claim 1 wherein forming an antireflective layer comprises forming a layer comprising titanium nitride.

* * * * *